US009075135B2

(12) United States Patent
Ke et al.

(10) Patent No.: US 9,075,135 B2
(45) Date of Patent: Jul. 7, 2015

(54) REPORTING CONNECTION FAILURE (71) Applicant: International Business Machines Corporation, Armonk, NY (US)

(72) Inventors: Yue Ke, Shanghai (CN); Xiang Ye Kong, Shanghai (CN); ShaoHua Li, Shanghai (CN); Binqi Zhang, Shanghai (CN)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 116 days.

(21) Appl. No.: 13/916,629

(22) Filed: Jun. 13, 2013

(65) Prior Publication Data

US 2014/0001342 A1    Jan. 2, 2014

(30) Foreign Application Priority Data

Jun. 29, 2012  (CN) .......................... 2012 1 0224951

(51) Int. Cl.
| | |
|---|---|
| *H01R 13/641* | (2006.01) |
| *G01S 17/06* | (2006.01) |
| *G01V 8/20* | (2006.01) |
| *G01R 31/04* | (2006.01) |

(52) U.S. Cl.
CPC . *G01S 17/06* (2013.01); *G01V 8/20* (2013.01); *H01R 13/641* (2013.01); *G01R 31/043* (2013.01)

(58) Field of Classification Search
CPC ............. H01R 13/639; H01R 13/6683; H01R 13/717; H01R 25/00; H01R 13/72; H01R 13/641; G01V 8/20; G01R 31/043; G01R 31/045; G01S 17/026

USPC ............ 250/221, 222.1, 239, 208.2; 439/445, 439/488, 489, 490, 620.15; 324/244.1, 314, 324/337, 501; 356/4.02, 394; 340/548
See application file for complete search history.

(56) References Cited

U.S. PATENT DOCUMENTS

| | | | |
|---|---|---|---|
| 5,134,617 A | 7/1992 | McRoy | |
| 5,169,329 A * | 12/1992 | Taguchi | ........................ 439/188 |
| 7,854,624 B1 | 12/2010 | Pepe | |
| 2003/0018843 A1 | 1/2003 | Cooper et al. | |
| 2004/0166725 A1 | 8/2004 | Simmel | |

(Continued)

FOREIGN PATENT DOCUMENTS

| | | |
|---|---|---|
| EP | 0736229 B1 | 3/1999 |
| JP | 200673213 A | 3/2006 |

OTHER PUBLICATIONS

NEC Corp, "Connection Confirmation System of Connector, Its Method and Connector", English abstract JP2006073213A Mar. 16, 2006, 13 pages.

*Primary Examiner* — Georgia Y Epps
*Assistant Examiner* — Don Williams
(74) *Attorney, Agent, or Firm* — Katherine S. Brown; Jeffrey L. Streets (57) ABSTRACT

An electronic system, connection failure reporting system and related methods. An electronic system may include a passive component of a connector; a detecting unit configured to detect presence of an active component of the connector in at least three points not in the same line on the passive component of the connector; and a connection status determining unit configured to determine a connection status of said connector based upon detecting results of the at least three points on the passive component of the connector. A connection problem of the connector can be identified, including identification of the type of connection failure.

8 Claims, 8 Drawing Sheets

(56) References Cited

U.S. PATENT DOCUMENTS

| | | |
|---|---|---|
| 2005/0112934 A1 | 5/2005 | Zhao et al. |
| 2008/0122579 A1 | 5/2008 | German et al. |
| 2011/0246138 A1 | 10/2011 | Chung et al. |
| 2011/0256767 A1 | 10/2011 | Malstrom et al. |

* cited by examiner

REPORTING CONNECTION FAILURE

CROSS-REFERENCE TO RELATED APPLICATIONS

This application claims priority under 35 U.S.C. §119 to Chinese Patent Application No. 201210224951.8 filed on Jun. 29, 2012, the entire text of which is specifically incorporated by reference herein.

BACKGROUND

1. Field of the Invention

The present invention relates to an electronic system test, and more specifically, to an electronic system, a connection failure reporting system and related methods.

2. Background of the Related Art

Electronic products have become increasingly complicated due to sophisticated printed circuit board (PCB) design and layout. An electronic product will often include a large number of connectors. The term "connectors" refers to components for connection, such as plugs and sockets, screws and nuts, pins and jacks, cards and slots and the like. Connectors may include active components and passive components. For example, plugs, screws, pins and cards as stated above are active components, while sockets, nuts, jacks and slots are passive components. Occasionally, an electronic product fails just because one of its connectors is not tightly connected.

BRIEF SUMMARY

One embodiment of the present invention provides a system comprising: a passive component of a connector; a detecting unit, configured to detect at least three points not in the same line on the passive component of the connector; and a connection status determining unit, configured to determine a connection status of said connector based upon detecting results of the at least three points on the passive component of the connector.

Another embodiment of the present invention provides a connection failure reporting system, comprising: a connection status determining unit, configured to determine a connection status of a connector based upon detecting results of at least three points not in the same line on the passive component of the connector; and a connection failure reporting unit, configured to indicate whether there is a connection failure in said connector according to the connection status of the connector determined by the connection status determining unit.

BRIEF DESCRIPTION OF THE SEVERAL VIEWS OF THE DRAWINGS

From the more detailed description of some embodiments of the present disclosure in conjunction with the accompanying drawings, the above and other objects, features and advantages of the present disclosure will become more apparent, wherein the same reference generally refers to the same components in the embodiments of the present disclosure.

DETAILED DESCRIPTION

One embodiment of the present invention provides a system comprising: a passive component of a connector; a detecting unit, configured to detect at least three points not in the same line on the passive component of the connector; and a connection status determining unit, configured to determine a connection status of said connector based upon detecting results of the at least three points on the passive component of the connector.

Another embodiment of the present invention provides a connection failure reporting system, comprising: a connection status determining unit, configured to determine a connection status of a connector based upon detecting results of at least three points not in the same line on the passive component of the connector; and a connection failure reporting unit, configured to indicate whether there is a connection failure in said connector according to the connection status of the connector determined by the connection status determining unit.

A further embodiment of the present invention provides a connection detecting method, comprising: detecting at least three points not in the same line on a passive component of a connector; and determining a connection status of said connector based upon detecting results of the at least three points on the passive component of the connector.

Optionally, embodiments of the present invention may identify the connection problem of the connector, such as identifying a kind of connection failure (not connected, connect but not tightly, etc.).

In another option, embodiments of the present invention test whether connection failures have occurred to a system without altering the existing design of the active component, thereby enhancing the flexibility and configurability of the system. Because the present invention performs the test in the passive component, there is no need to alter the design of the active component, thus, the connection can be tested irrespective of the connection means of the active component.

In a further option, embodiments of the present invention may report the identity of the connector where the connection failure has occurred from the perspective of the entire electronic system.

Some embodiments of the present invention will be described in more detail with reference to the accompanying drawings. However, the present invention can be implemented in various manners, and thus should not be construed to be limited to the embodiments disclosed herein. On the contrary, these embodiments are included to provide a thorough and complete understanding of the present invention to those skilled in the art.

Figure 1:
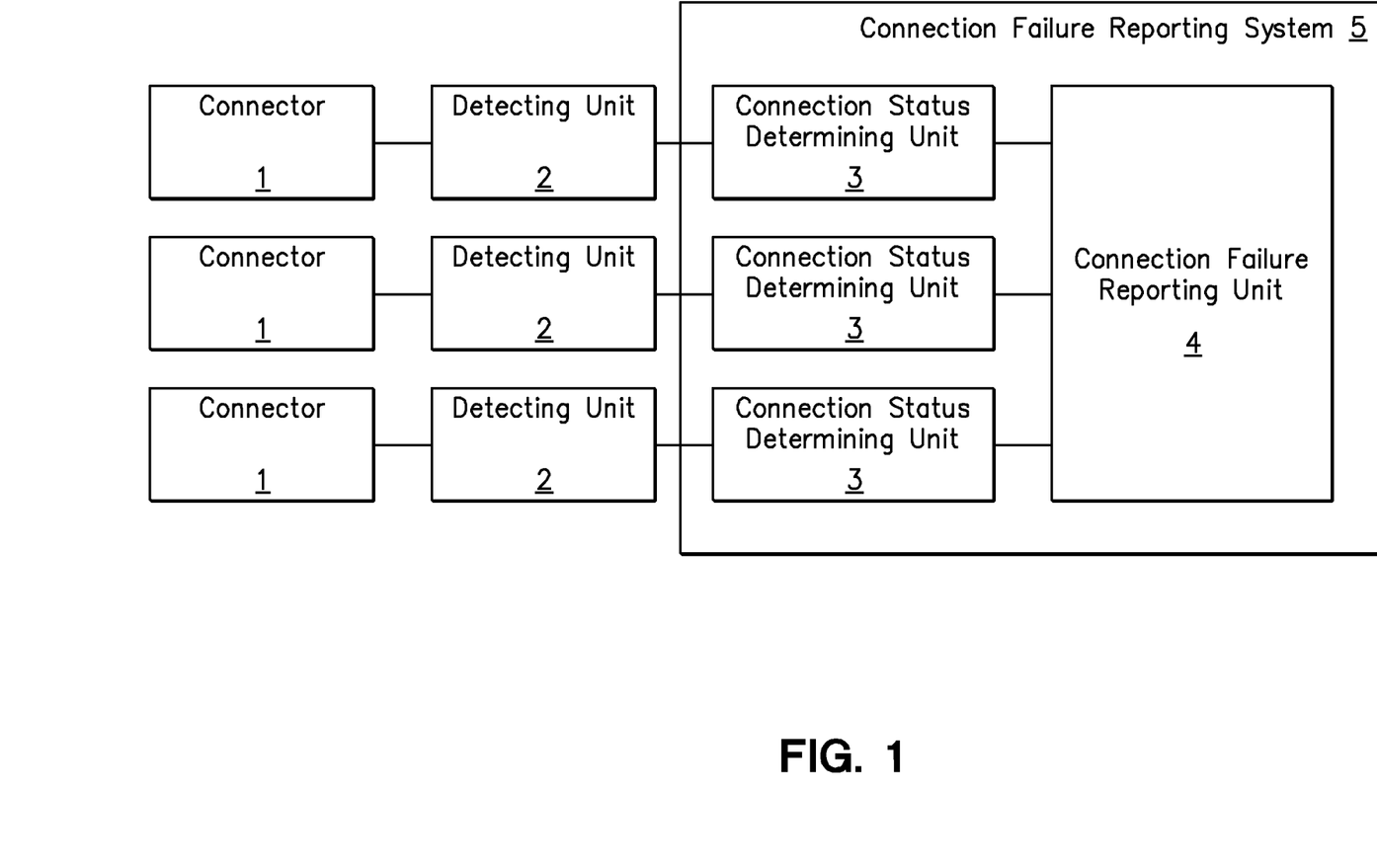
FIG. 1 is a diagram of an electronic system according one embodiment of the present invention.

FIG. 1 is a diagram of an electronic system according one embodiment of the present invention. The electronic system comprises connectors (actually, the passive component of the connector) 1, detecting units 2, connection status determining units 3 and a connection failure reporting unit 4. If a user does not want the system to report the identity of the connecter where a connection failure has occurred from the perspective of the entire electronic system, then the connection failure reporting unit 4 can be omitted. Although the system of FIG. 1 shows a plurality of connectors 1, a plurality of detecting unit 2 and a plurality of connection status determining unit 3, there can be only one of them.

The detecting unit 2 is configured to detect presence of an active component of a connector in at least three points (locations) not in the same line on the passive component of the connector 1. The detecting unit 2 provides signals that indicate the presence or absence of an active component at each of the at least three points.

The connection status determining unit 3 is configured to determine the connection status of the connector 1 based upon detecting results (i.e., the signals provided by the detecting unit 2) of the at least three points on the passive component of the connector by the detecting unit 2.

The connection failure reporting unit 4 is configured to indicate whether there is a connection failure in any of the connectors according to the connection status determined by each of the connection status determining units 3. As a concrete embodiment, LED1 in FIGS. 4A-4B may be used to provide a visual indicator of whether there is a connection failure in the connector on path2.

Figure 4A:
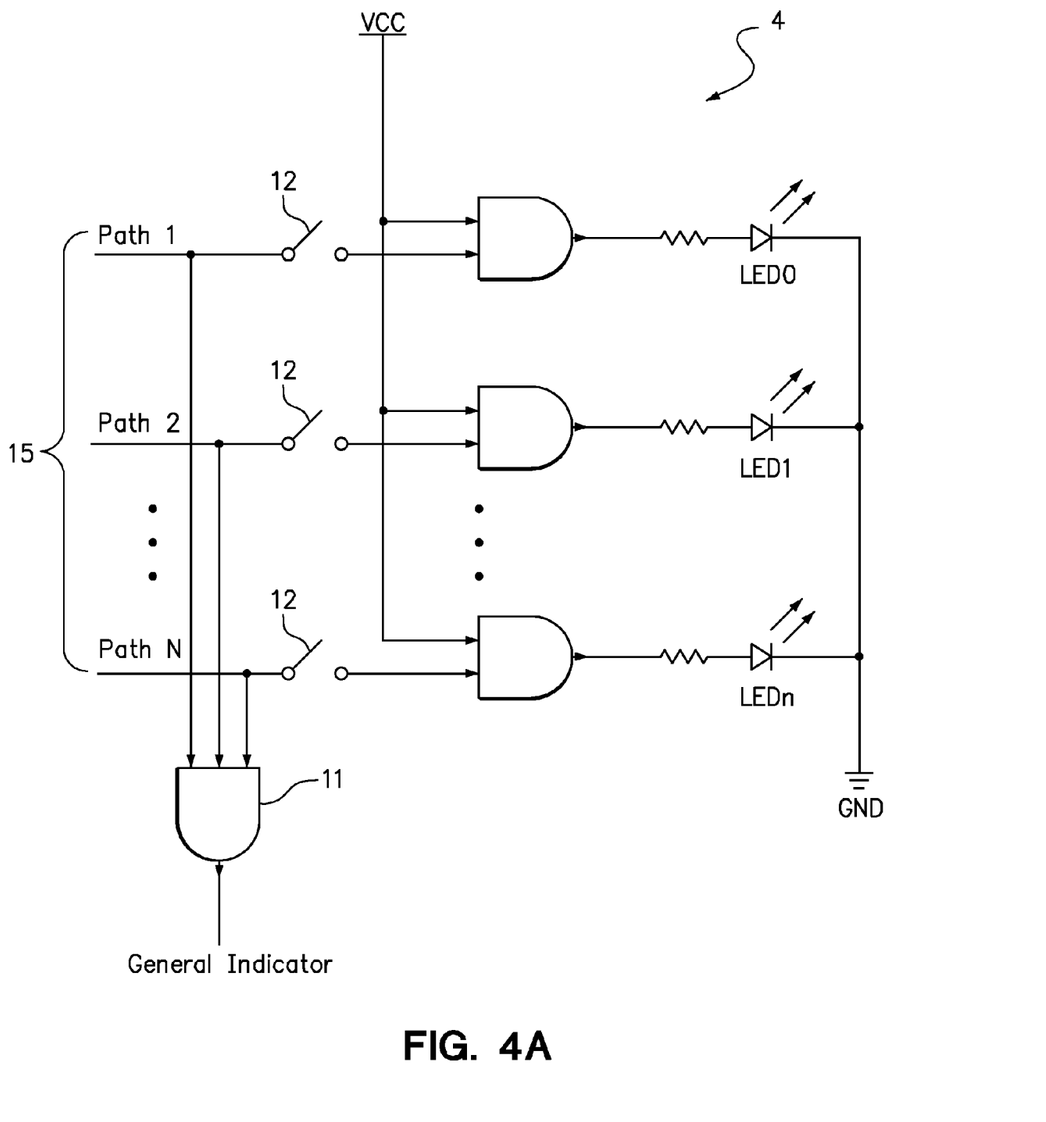
FIG. 4A is a schematic diagram of a connection failure reporting unit according one embodiment of the present invention.
Figure 4B:
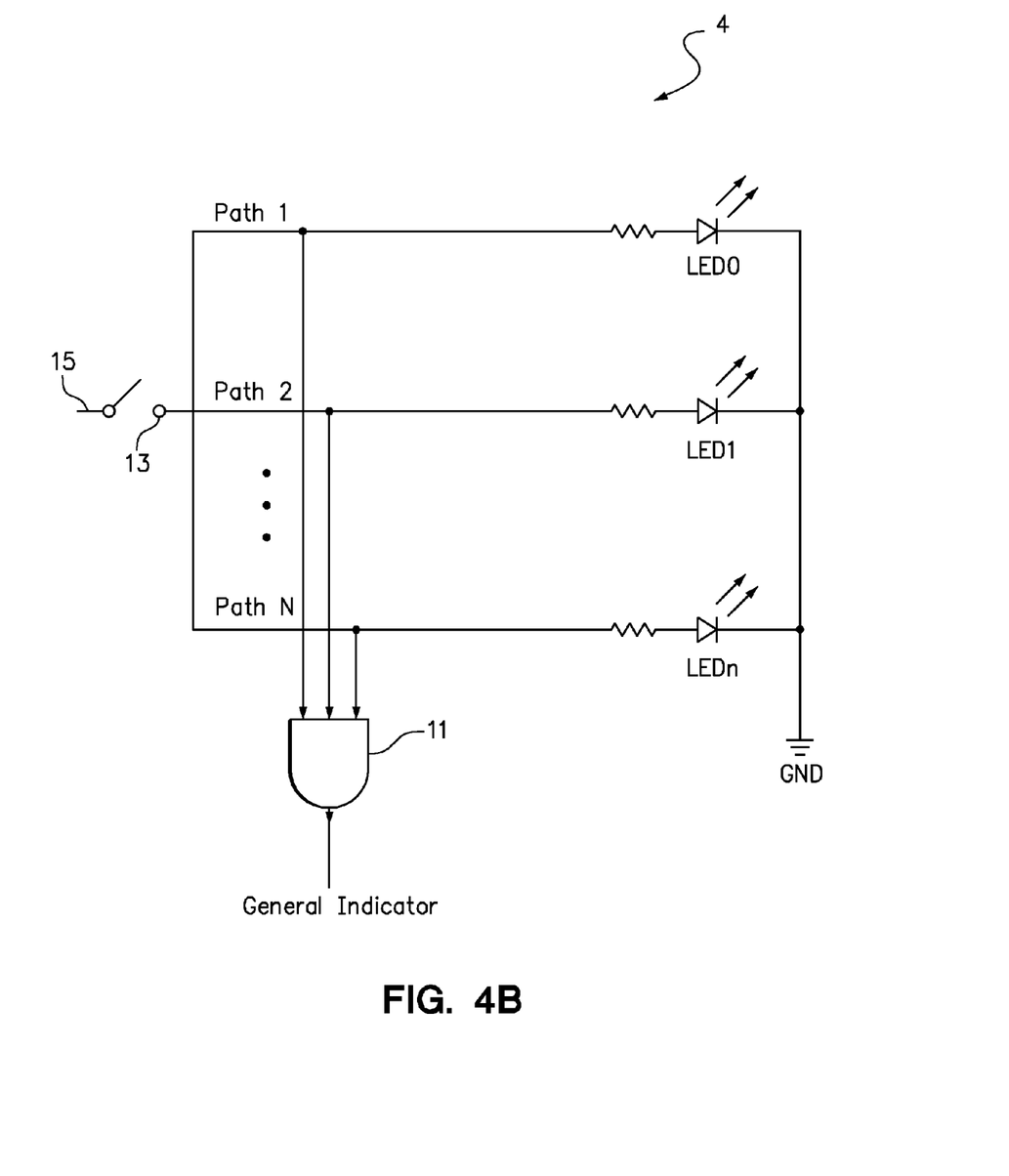
FIG. 4B is a schematic diagram of a connection failure reporting unit according to another embodiment of the present invention.

Additionally, when there are a plurality of connectors 1, a plurality of detecting units 2, and a plurality of connection status determining units 3, the connection failure reporting unit 4 may be further configured to indicate whether there is a connector in the plurality of connectors to which connection failures have occurred, the AND gate 11 in FIGS. 4A-4B can be connected to a general indicator.

In FIG. 1, the connection status determining unit 3 and the connection failure reporting unit 4 constitute a connection failure reporting system 5.

In some embodiments, the connection status may be selected from "tightly connected", "connected but not tightly", and "not connected". A specific example of each of these types of connection status will be illustrated by referring FIGS. 2A-2D below.

FIGS. 2A-2D show an example of a connector as a combination of a plug and a socket. The socket is the passive component, and the plug is the active component. In other examples, the connector may take various forms such as screw and nut, pin and jack, etc. Furthermore, the detecting units in FIGS. 2A-2D employ mechanical devices that detect the presence of the plug in the socket, but the detecting unit may alternatively employ other detecting forms, such as optical detection.

Figure 2A:
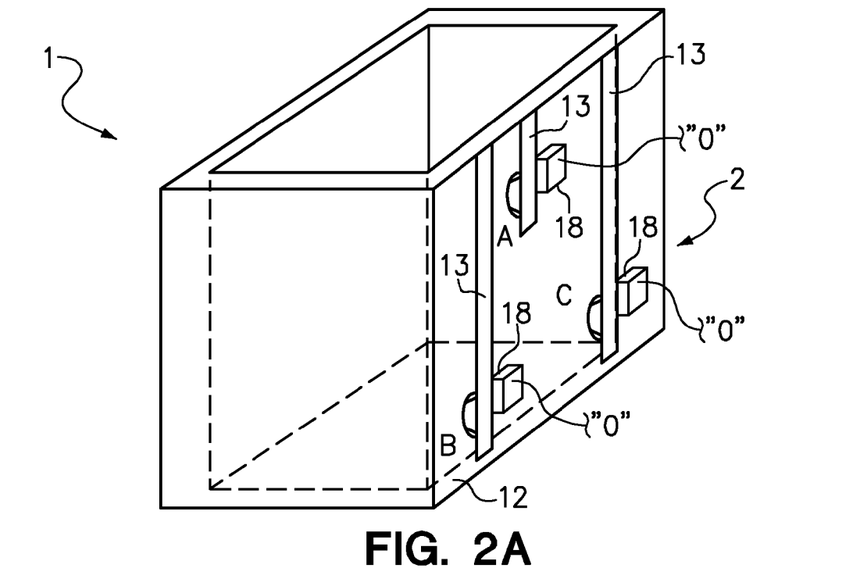
FIG. 2A is a perspective view of a socket having elastic sheets A, B and C at three test points, respectively, according one embodiment of the present invention.
Figure 3A:
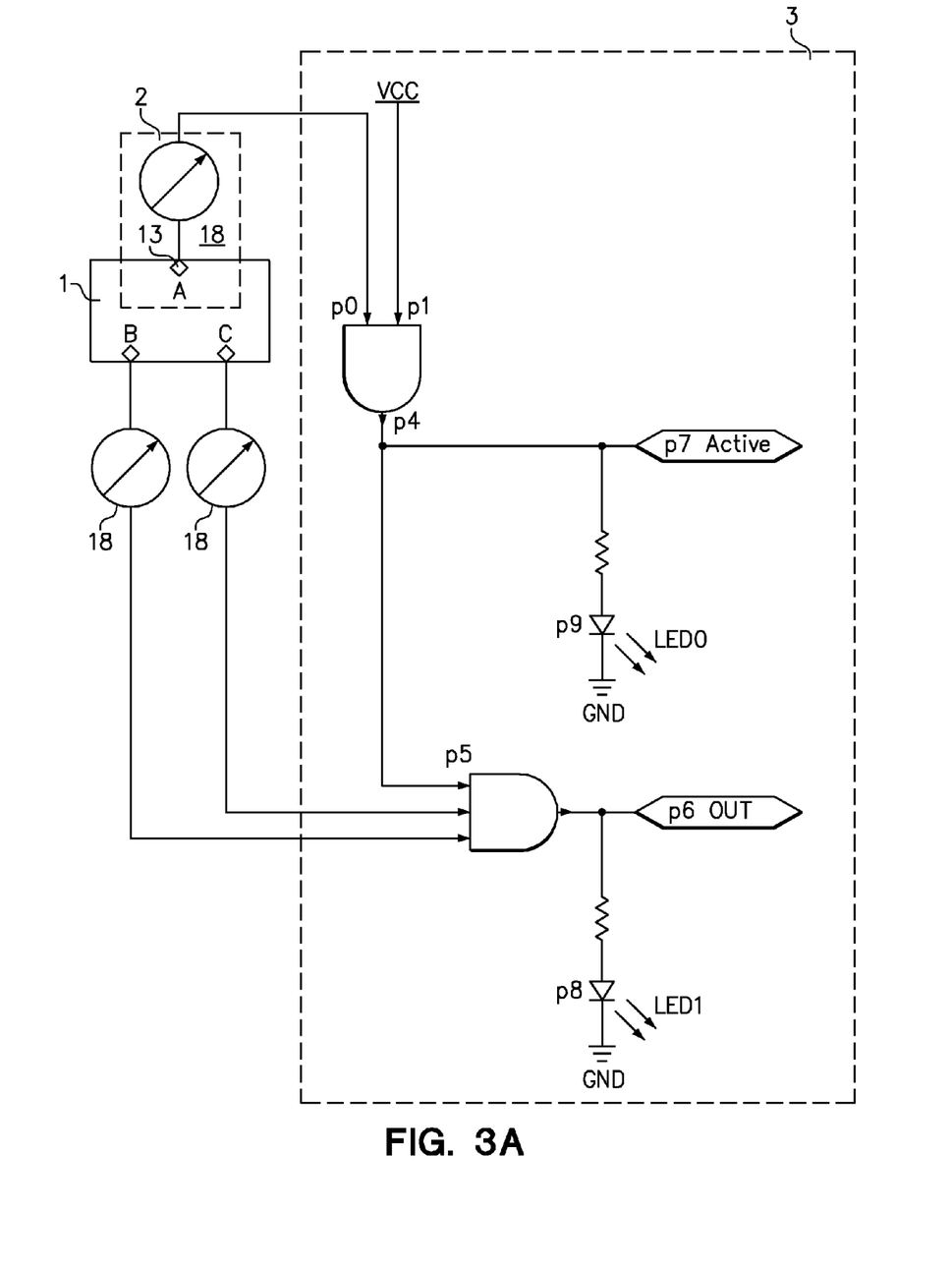
FIG. 3A is a schematic diagram of a connection status determining unit coupled to the connector and the detecting unit according one embodiment of the present invention.

In this specific example, the detecting unit 2 comprises elastic sheets 13 provided at the at least three points (FIG. 2A shows three points) on the socket 12 (the passive component of the connector), and pop out sensors 18 connected with the elastic sheets 13, as shown in FIG. 2A. In response to inserting a plug 11 (the active component) at the elastic sheet 13 at a certain point of the at least three points on the passive component, the elastic sheet 13 pops out, thereby is detected by the pop out sensor 18. The pop out sensor 18 outputs signal "1" to p0 terminal of the connection status determining unit 3 after detecting the pop out of the elastic sheet, as shown in FIG. 3A.

As shown in the example of FIG. 2A, three elastic sheets 13, i.e., A, B and C, are provided on the side surface of the socket 12. Other numbers of elastic sheets can be provided, as long as each type of connection status of the plug and socket can be detected as described later. In a preferred configuration, a first elastic sheet is provided near the upper edge of one side of the socket, such as A, and second and third elastic sheets are provided near the lower left corner and lower right corner of one side of the socket, such as B and C. Of course, other configurations may be used as well. For example, four elastic sheets can be provided with a socket, with the elastic sheets located on the upper left side, upper right side, lower left side and lower right of the side surface of the socket.

Figure 2B:
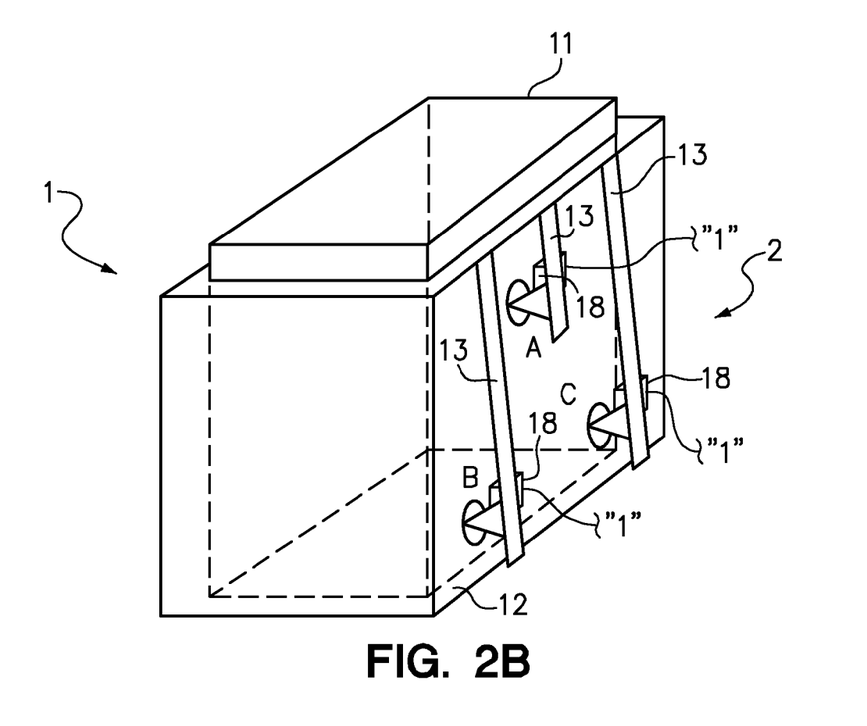
FIG. 2B is a perspective view of a plug that is fully inserted into the socket such that all of the elastic sheets A, B and C pop out according one embodiment of the present invention.
Figure 2C:
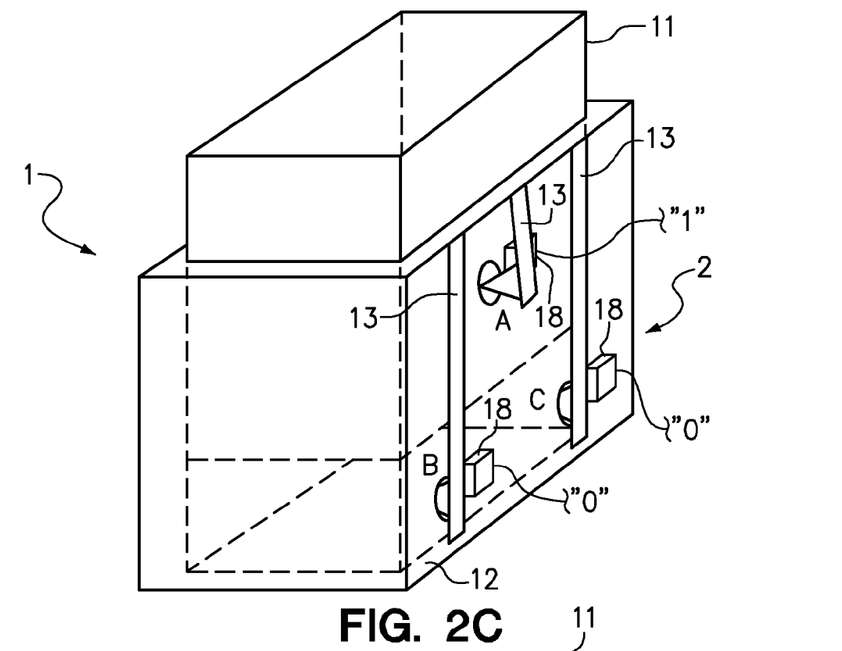
FIG. 2C is a perspective view of the plug inserted only half way into the socket such that the elastic sheet A pops out, while the elastic sheets B and C do not pop out according one embodiment of the present invention.
Figure 2D:
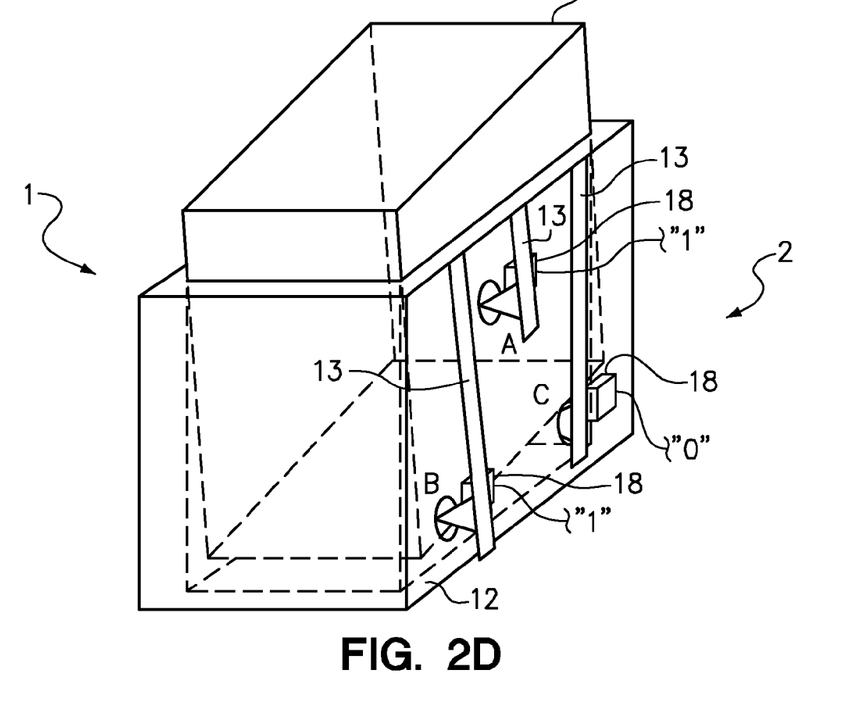
FIG. 2D is a perspective view of the plug inserted into the socket and sitting at a tilt or angle such that the elastic sheets A and B pop out, while the elastic sheet C does not pop out according one embodiment of the present invention.

The elastic sheet is a sheet having elasticity. Usually, the elastic sheet protrudes toward the inside of the socket. Once being squeezed or pushed from the inside the socket, the elastic sheet will pop out to the outside of the socket. FIG. 2A shows the three elastic sheets A, B and C have not been squeezed and thus protrude toward the inside of the socket. FIG. 2B shows the three elastic sheets A, B and C having been popped out towards the outside of the socket due to the plug pushing on the elastic sheet from the inside of the socket. As shown in FIG. 2A, before the plug 11 is inserted into the socket 12, each of the elastic sheets A, B and C protrudes toward the inside of the socket. As shown in FIG. 2B, when the plug 11 is entirely inserted into the socket 12, each of the elastic sheets A, B and C pops out towards the outside of the socket due to being squeezed by the plug 11. As shown in FIG. 2C, when the plug 11 is inserted only half-way into the socket 12, the elastic sheet A pops out due to being squeezed by the plug 11, and the elastic sheets B and C do not pop out towards the outside of the socket because they have not been squeezed. As shown in FIG. 2D, when the plug 11 is inserted into the bottom of the socket 12 in a tilt or slanted angle relative to the socket, the elastic sheets A and B are squeezed by the plug 11 and pop out towards the outside of the socket, and the elastic sheet C is not squeezed by the plug 11 since the plug 11 is in a tilt or slanted angle, and thus elastic sheet C does not pop out towards the outside of the socket.

The connection status of the connector shown in FIG. 2A is referred to "not connected". The connection status of the connector shown in FIG. 2B is referred to "tightly connected". The connection status of the connectors in FIGS. 2C and 2D are referred to as "connected but not tightly".

Although the foregoing embodiment of the present invention has been described by using elastic sheets as an example, those skilled in the art having the benefit of this disclosure will understand that other mechanical devices and methods may be implemented to accomplish the desired detection of a connection status. Furthermore, the detecting unit may employ optical devices and methods instead of mechanical devices and methods. For example, the detecting unit may comprise light sources provided at the at least three points on the passive component of the connector and light sensors provided on the opposite side of the socket directly aligned with the light sources. In response to the active component being inserted at a certain point of the at least three points on the passive component, the light sensor at this point cannot sense light emitted from the light source.

For example, the three elastic sheets A, B and C on the socket of FIGS. 2B, 2C and 2D can be replaced by three point light sources, and three point light sensors can be provided on the locations on the backside of the socket corresponding to the current three elastic sheets. If the plug 11 has not been inserted into the socket 12, the light emitted by the three point light sources can be received by the three point light sensors, since they light path is completely unblocked, and the three point light sensors output "0" to p0 of FIG. 3A. When the plug 11 is inserted half way into the socket 12, the light sensor at point A is blocked by the plug, thus the light sensor at point A cannot receive light, thus outputting "1". When the plug 11 is entirely inserted into the socket 12, the light sensors at points B and C are also blocked by the plug, thus the point light sensors at points B and C also cannot receive light, thus each outputting "1". A specific example of the optical device and method of detecting a connection has been explained above, however, those skilled in the art having the benefit of this disclosure will understand that other optical devices and methods may also be implemented in accordance with the present invention. Furthermore, those skilled in the art having the benefit of this disclosure will understand that other detection devices and methods may also be implemented in accordance with the present invention.

FIG. 3A is a schematic diagram of a connection status determining unit 3 coupled with the connector and detecting unit according one embodiment of the present invention.

When, as shown in FIG. 2A, the plug 11 has not been inserted into the socket 12, none of the elastic sheets A, B and C will pop out. The current sensor 18 connected with elastic sheet A outputs "0" to p0. VCC is set to 1. After p0 and p1 (which is equal to VCC) pass through AND gate p4, the resulting output p7 is 0, and the LED p9 goes out. At this point, the three inputs of AND gate p5 are also 0, thus, the resulting output p6 is 0, and the LED p8 goes out.

When, as shown in FIG. 2B, plug 11 is entirely inserted into the socket 12, all the elastic sheets A, B and C pop out. The current sensor 18 connected with the elastic sheet A outputs "1" to p0. VCC is set to 1. After p0 and p1 (which is equal to VCC) pass through AND gate p4, the resulting output p7 is 1, and the LED p9 lights up. At this point, the three inputs of the AND gate p5 are also 1, thus, the resulting output p6 is 1, and the LED p8 lights up.

When, as shown in FIG. 2C, the plug 11 is inserted halfway into the socket 12, the elastic sheet A pops out, and the elastic sheets B and C do not pop out. The current sensor 18 connected with the elastic sheet A outputs "1" to p0. VCC is set to 1. After p0 and p1 (which is equal to VCC) pass through AND gate p4, the resulting output p7 is 1, and the LED p9 lights up. At this point, since the current sensor 18 connected with the elastic sheet A outputs "0", the resulting output p6 is 0, and the LED p8 goes out.

When, as shown in FIG. 2D, the plug 11 is inserted into the socket 12 in a tilt or slanted angle, the elastic sheets A and B pop out, and the elastic sheet C does not pop out. The current sensor 18 connected with the elastic sheet A output "1" to p0. VCC is set to 1. After p0 and p1 (which is equal to VCC) pass through AND gate p4, the resulting output p7 is 1, and the LED p9 is lit up. At this moment, since the current sensor 18 connected with the elastic sheet A outputs "0", the resulting output p6 is 0, and the LED p8 goes out.

Thus, it can be seen that p7 can identify whether a connector is connected or not, and p6 can identify whether the connector is tightly connected or not. For the situation not connected, both outputs p7 and p6 are 0; for the situation tightly connected, both outputs p7 and p6 are 1; for the situation connected but not tightly, output p7=1, and p6=0. The connection status can de determined through the combination of p7 and p6.

In FIG. 3A, when the plug 11 is not inserted into the socket 12, p0=0, thus the connection status determining unit 3 does not identify a connection.

Figure 3B:
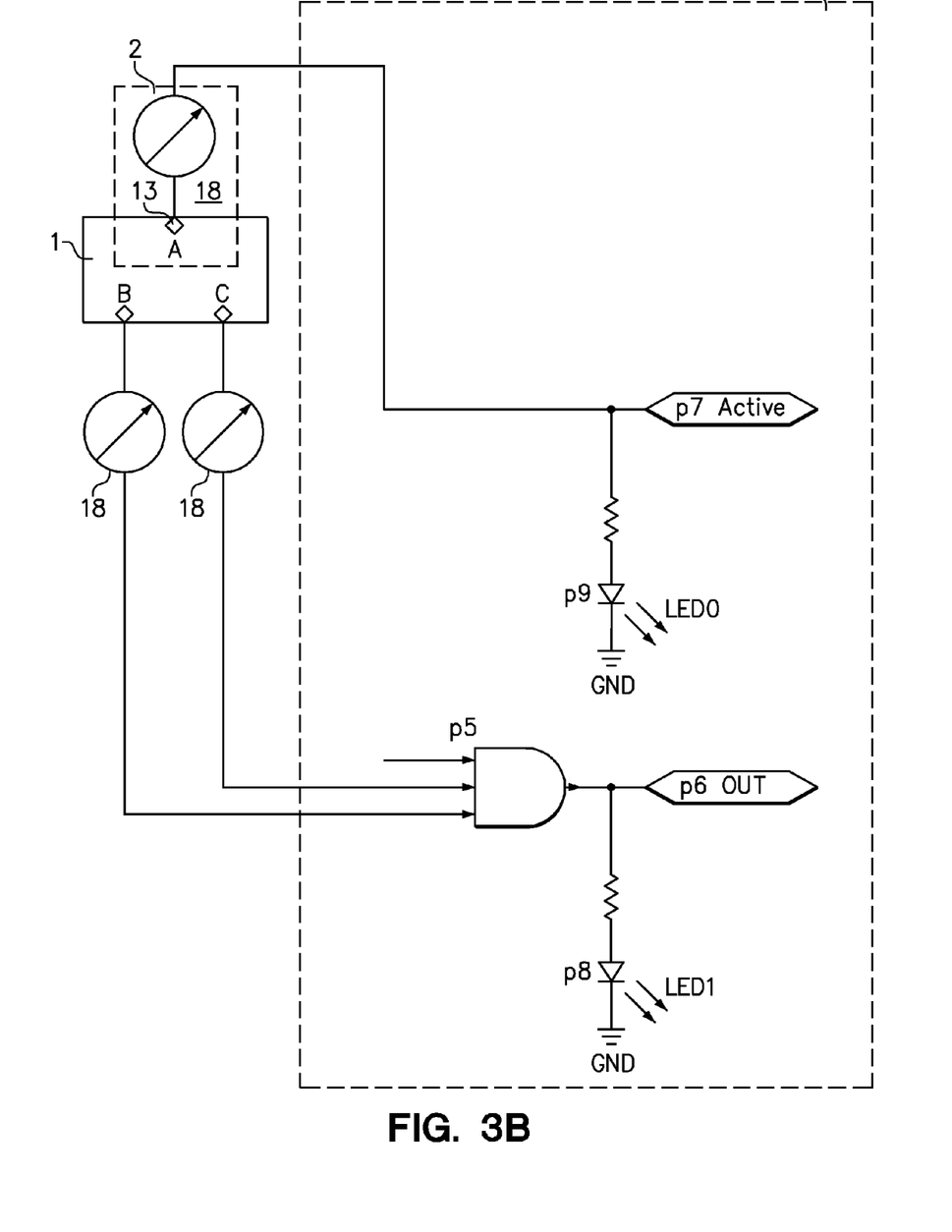
FIG. 3B is a schematic diagram of a connection status determining unit coupled to the connector and the detecting unit according to another embodiment of the present invention.

FIG. 3B is a schematic diagram of a connection status determining unit coupled with the connector and detecting unit according to another embodiment of the present invention. The function that it realized is similar to that of FIG. 3A.

When, as shown in FIG. 2A, the plug 11 is not inserted into the socket 12, none of the elastic sheets A, B and C pops out. The output p7 is 0, and the LED p9 goes out. The two inputs of the AND gate p5 also are 0, thus, the resulting output p6 is 0, and p8 goes out.

When, as shown in FIG. 2B, the plug 11 is entirely inserted into the socket 12, all the elastic sheets A, B and C pop out. The output p7 is 1, and the LED p9 lights up. At this point, the two inputs of the AND gate p5 are also 1, thus, the resulting output p6 is 1, and the LED p8 lights up.

When, as shown in FIG. 2C, the plug 11 is inserted into the socket 12 in half, the elastic sheet A pops out, and the elastic sheets B, C do not pop out. The output p7 is 1, and the LED p9 lights up. At this point, since the current sensor 18 connected with the elastic sheet A outputs "0", thus, the resulting output p6 is 0, and the LED p8 goes out.

When, as shown in FIG. 2D, the plug 11 is inserted into the socket 12 in tilt, the elastic sheets A and B pop out, and the elastic sheet C does not pop out. The output p7 is 1, and the LED p9 lights up. At this point, since the current sensor 18 connected with elastic sheet A outputs "0", thus, the resulting output p6 is 0, and the LED p8 goes out.

Although two examples of a specific circuit of the connection status determining unit 3 have been presented in FIGS. 3A-3B, those skilled in the art having the benefit of this disclosure will be able to implement various other possible circuits within the scope of the present invention to perform the function of the connection status determining unit 3, i.e., determining the connection status of a connector based upon detecting the results of the at least three points not in the same line on the passive component of the connector.

The resulting outputs p6 and p7 from FIGS. 3A and 3B are for one connector. The p6 or p7 is inputted to one path l5 of FIG. 4A or FIG. 4B. Each path l5 represents the output of one connector in the electronic system.

It is assumed that p6 is inputted to a path l5. p6=1 represents that a corresponding connector is tightly connected. Since VCC=1, the output result of the AND gate in said path is 1, such that the LED light in the path lights up. p6=0 represents that the connector is connected but not tightly or not connected. The output result of the AND gate in said path is 0, such that the LED light in said path goes out. Embodiments of the invention may use types of indicator devices other than an LED light. For example, the LED may be replaced by a loud speaker, vibrating circuit, etc. Moreover, a processing circuit can be added after the AND gate or LED light in respective paths, in order to process the indicated connector failure.

Alternatively, the input signal on each path of l5 is also connected to AND gate l1. Only when all the signals on each path of l5 are 1, the signal output from the AND gate l1 is 1. Thus, it is a general indicator, which indicates whether there is a connector in the plurality of connectors to which a connector failure has occurred. The connection failure here refers to connected but not tightly or not connected. When the signal output from the AND gate l1 is 0, check which LED of the LEDs on each path goes out. The gone out LED represents that the connector of said path is "connected but not tightly" or "not connected". Thereafter, by checking p7 in FIGS. 3A-3B, one can known whether the connector is "connected but not tightly" or "not connected".

It is assumed that p7 is inputted into l5 from each of the connectors. P7=1 represents that said connector is "connected but not tightly" or "tightly connected". Since VCC=1, the output result of the AND gate in said path is 1, such that the LED light in said path lights up. P7=0 represents that said connector is not connected. The output result of the AND gate in said path is 0, the LED light in said path goes out.

Optionally, the input signal on each path of l5 may also be connected to the AND gate 11. Only when all the signals on each path of l5 are 1, will the signal output from the AND gate 11 be 1. Thus, it is a general indicator, which indicates whether there is a connector in the plurality of connectors to which a connector failure has occurred. The connection failure here refers to "connected but not tightly" or "not connected". When the signal output from the AND gate 11 is 0, the user would then check which LED of the LEDs on each path goes out. The LED that has gone out indicates that the connector of said path is not connected.

Whether p7 or p6 is connected to l5 depends on whether the requirement for the connection status is strict. If the requirement for the connection status is not strict, "connected but not tightly" can be deemed as no failure, at this point, the manner of connecting p7 to l5 can be employed. Otherwise, the manner of connecting p6 to l5 should be employed.

The difference between FIG. 4A and FIG. 4B lies in that: a general switch 13 is provided in FIG. 4B, for switching on or off to enable or disenable all connector failure LED indicators; branch switches 12 are provided in FIG. 4A, for switching on or off to enable or disenable all connector failure LED indicators. By providing the general switch, it can achieve the aim of whether or not to enable the connector failure reporting function in the present invention. That is, if undesired, the connector failure reporting function in the present invention may not be used. By providing branch switches, it is possible to control the set of connectors to be monitored. For the connectors that do not need to be connected, the corresponding branch switches can be turned off, thereby disable its detection function. The switch on and off can be used to enable or disable the detection function generally or separately.

Although two circuit examples of the connection failure reporting unit 4 have been described referring to FIGS. 4A and 4B, those skilled in the art having the benefit of the present disclosure will be able to design other circuit structures falling within the scope of the present invention.

Additionally, one embodiment of the present invention can have a self-detection function. When it is assumed that all connectors in the electronic system are switched off, i.e., all the LED lights in FIG. 4A and FIG. 4B go out, it can detect whether the electronic system according one embodiment of the present invention works well or not.

In some embodiments, the connection status determining unit 3 and the connection failure reporting unit 4 are independently powered. By "independently powered", it means that the power to these units is not dependent on the startup or shutdown of the whole machine. That is, even when the whole machine is shut down, the connection status determining unit 3 and the connection failure reporting unit 4 still have independent power, and thus can work well. Hence, it can achieve the aim of completing detection even when the whole machine is shut down. Although the electronic system as shown in FIG. 1 comprises connectors 1, detecting units 2, connection status determining units 3 and the connection failure reporting unit 4, an actually running machine will not merely comprise a connector and the detection related unit of the connector. In practice, a whole entire machine must contain main units achieving the main function of said machine. For example, a computer may include a processor, display, memory, etc. as well as one or more connectors and one or more detecting units. Some embodiment of the present invention can perform detection and failure locating of the connector even before the computer is started up and the processor and display thereof have not begun running.

There are many ways of making the connection status determining unit 3 and the connection failure reporting unit 4 "independently powered". For example, the power supply VCC of the main board terminal can be used for powering, as shown in FIGS. 3A and 5A, where the power supply VCC supplies power even when the machine has not started up yet. Furthermore, the connection status determining unit 3 and connection failure reporting unit 4 may also receive power from their own battery. Still further, the general power of the machine also can be used for powering, but the general power to the connection status determining unit 3 and the connection failure reporting unit 4 may always be supplied rather than being enabled at the startup of the machine.

Figure 5:
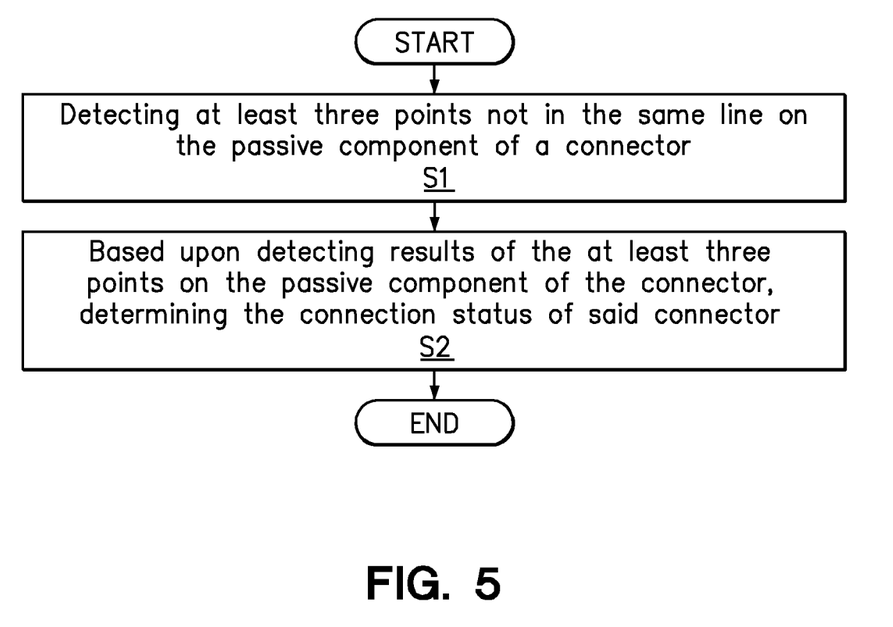
FIG. 5 is a flow chart of the connector detecting method according one embodiment of the present invention.

FIG. 5 is a flowchart of a connector detecting method according one embodiment of the present invention. In step S1, the method detects the presence of an active component in at least three points not in the same line on the passive component of a connector. In step S2, the method determines the connection status of the connector based upon the detecting results of the at least three points on the passive component of the connector.

In one embodiment, the method may further comprise indicating whether said connector has a connection failure according to the determined connection status of the connector.

In another embodiment of the method, detecting at least three points not in the same line on the passive component of a connector, comprises: in response to an active component being inserted at a certain elastic sheet of the elastic sheets provided at the at least three points on the passive component respectively, said elastic sheet pops out and is thereby detected by the pop out sensor connected with said elastic sheet.

In yet another embodiment of the method, detecting at least three points not in the same line on the passive component of a connector may comprise: in response to an active component being inserted at a certain sensor of the light sensors provided at the at least three points on the passive component respectively, the light sensor can not sense light emitted by the light source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An electronic system comprising:
  a passive component of a connector;
  a detecting unit secured to the passive component and configured to detect the presence of an active component of the connector received within the passive component of the connector in at least three points not in the same line on the passive component of the connector; wherein the detecting unit comprises elastic sheets provided at the at least three points on the passive component of the connector and pop out sensors connected with the elastic sheets, wherein in response to the active component being inserted at the elastic sheet at a certain point of the at least three points on the passive component, the elastic sheet pops out and is thereby detected by the pop out sensor and
  a connection status determining unit, configured to determine a connection status of said connector based upon detecting results of the at least three points on the passive component of the connector by the detection unit.

2. The electronic system of claim 1, further comprising:
  a connection failure reporting unit configured to indicate whether there is a connection failure in the connector according to the connection status of the connector determined by the connection status determining unit.

3. The electronic system of claim 2, wherein the connection status can distinguish between "tightly connected", "connected but not tightly connected", and "not connected".

4. The electronic system of claim 2, wherein the electronic system comprises passive components of a plurality of connectors, a plurality of detecting units, and a plurality of connection status determining units, and wherein the connection failure reporting unit is further configured to indicate whether there is a connector in the plurality of connectors to which connection failures have occurred.

5. A connection failure reporting system, comprising:
  a connection status determining unit configured to determine a connection status of a connector based upon detecting presence of an active component of the connector received within a passive component of the connector in at least three points not in the same line on the passive component of the connector; wherein the detecting unit comprises elastic sheets provided at the at least three points on the passive component of the connector and pop out sensors connected with the elastic sheets, wherein in response to the active component being inserted at the elastic sheet at a certain point of the at least three points on the passive component, the elastic sheet pops out and is thereby detected by the pop out sensor and
  a connection failure reporting unit configured to indicate whether there is a connection failure in said connector according to the connection status of the connector determined by the connection status determining unit.

6. The connection failure reporting system of claim 5, wherein the connection status can distinguish between "tightly connected", "connected but not tightly connected", and "not connected".

7. The connection failure reporting system of claim 5, wherein the system comprises a plurality of connection status determining units for a plurality of connectors, wherein the connection failure reporting unit is further configured to indicate whether there is a connector in the plurality of connectors to which a connection failure has occurred.

8. The connection failure reporting system of claim 5, wherein the connection failure reporting unit and the connection status determining unit are powered independent from an electronic system that includes the connection failure reporting unit and the connection status determining unit.

* * * * *